United States Patent
Zhao et al.

(10) Patent No.: US 11,849,015 B1
(45) Date of Patent: Dec. 19, 2023

(54) SHIFT-REGISTER-BASED CLOCK PHASE INTERPOLATOR

(71) Applicant: Marvell Asia Pte Ltd, Singapore (SG)

(72) Inventors: Hui Zhao, San Jose, CA (US); Zhendong Guo, San Jose, CA (US)

(73) Assignee: Marvell Asia Pte Ltd, Singapore (SG)

(*) Notice: Subject to any disclaimer, the term of this patent is extended or adjusted under 35 U.S.C. 154(b) by 117 days.

(21) Appl. No.: 17/455,784

(22) Filed: Nov. 19, 2021

Related U.S. Application Data

(60) Provisional application No. 63/116,540, filed on Nov. 20, 2020.

(51) Int. Cl.
*H04L 7/00* (2006.01)

(52) U.S. Cl.
CPC .................................. *H04L 7/0025* (2013.01)

(58) Field of Classification Search
CPC .................................................. H04L 7/0025
See application file for complete search history.

(56) References Cited

U.S. PATENT DOCUMENTS

| | | | | |
|---|---|---|---|---|
| 4,130,802 A * | 12/1978 | Nossen | ................ | H04L 27/2071 375/333 |
| 8,994,420 B2 * | 3/2015 | Eldredge | ................ | H03L 7/1976 375/376 |
| 2008/0164917 A1 * | 7/2008 | Floyd | .................... | H03L 7/1974 375/376 |
| 2011/0064176 A1 * | 3/2011 | Takada | ...................... | H03L 7/07 375/355 |
| 2019/0056760 A1 * | 2/2019 | Zhang | .................. | H03K 5/1506 |
| 2019/0386859 A1 * | 12/2019 | Lee | ................... | H04L 25/03885 |

* cited by examiner

*Primary Examiner* — Freshteh N Aghdam

(57) ABSTRACT

An integrated circuit device includes functional circuitry, and serializer/deserializer circuitry for serial communication with the functional circuitry. The serializer/deserializer circuitry includes phase interpolator circuitry for interpolating phases of a clock signal of the integrated circuit device. The phase interpolator circuitry includes a phase shift register having storage locations configured to represent the phases of the clock signal, and phase rotation control circuitry configured to decode a phase code signal to determine a shifting direction for phase selections in storage locations of the phase shift register. The phase rotation control circuitry may be configured to determine the shifting direction based on only the most significant bit and the second most significant bit of the phase code signal. The phase interpolator circuitry may further include weight decoder circuitry configured to derive, from the phase code signal, interpolation weights to control combination of selected phases of the clock signal.

18 Claims, 9 Drawing Sheets

1200

| Phase Control Code | Phase Control | | | Phase Selected | | | | | | Weight | |
|---|---|---|---|---|---|---|---|---|---|---|---|
| | Holdb | Shift_right | Shift_left | R1 | R2 | R3 | R4 | R5 | R6 | Phase_a | Phase_b |
| 0000 | 0 | 0 | 0 | 1 | 1 | 0 | 0 | 0 | 0 | 11111111 | 00000000 |
| 0001 | 0 | 0 | 0 | 1 | 1 | 0 | 0 | 0 | 0 | 01111111 | 00000001 |
| 0010 | 0 | 0 | 0 | 1 | 1 | 0 | 0 | 0 | 0 | 00111111 | 00000011 |
| 0011 | 0 | 0 | 0 | 1 | 1 | 0 | 0 | 0 | 0 | 00011111 | 00000111 |
| 0100 | 0 | 0 | 0 | 1 | 1 | 0 | 0 | 0 | 0 | 00001111 | 00001111 |
| 0101 | 0 | 0 | 0 | 1 | 1 | 0 | 0 | 0 | 0 | 00000111 | 00011111 |
| 0110 | 0 | 0 | 0 | 1 | 1 | 0 | 0 | 0 | 0 | 00000011 | 00111111 |
| 0111 | 0 | 0 | 0 | 1 | 1 | 0 | 0 | 0 | 0 | 00000001 | 01111111 |
| 1000 | 1 | 1 | 0 | 0 | 1 | 1 | 0 | 0 | 0 | 00000000 | 11111111 |
| 1001 | 0 | 0 | 0 | 0 | 1 | 1 | 0 | 0 | 0 | 00000001 | 01111111 |
| 1010 | 0 | 0 | 0 | 0 | 1 | 1 | 0 | 0 | 0 | 00000011 | 00111111 |
| 1011 | 0 | 0 | 0 | 0 | 1 | 1 | 0 | 0 | 0 | 00000111 | 00011111 |
| 1100 | 0 | 0 | 0 | 0 | 1 | 1 | 0 | 0 | 0 | 00001111 | 00001111 |
| 1101 | 0 | 0 | 0 | 0 | 1 | 1 | 0 | 0 | 0 | 00011111 | 00000111 |
| 1110 | 0 | 0 | 0 | 0 | 1 | 1 | 0 | 0 | 0 | 00111111 | 00000011 |
| 1111 | 0 | 0 | 0 | 0 | 1 | 1 | 0 | 0 | 0 | 01111111 | 00000001 |

| Phase Control Code | Phase Control | | | Phase Selected | | | | | | Weight | |
|---|---|---|---|---|---|---|---|---|---|---|---|
| | Holdb | Shift_right | Shift_left | R1 | R2 | R3 | R4 | R5 | R6 | Phase_a | Phase_b |
| 1111 | 0 | 0 | 0 | 0 | 0 | 1 | 1 | 0 | 0 | 00000000 | 11111111 |
| 1110 | 0 | 0 | 0 | 0 | 0 | 1 | 1 | 0 | 0 | 00000001 | 01111111 |
| 1101 | 0 | 0 | 0 | 0 | 0 | 1 | 1 | 0 | 0 | 00000011 | 00111111 |
| 1100 | 0 | 0 | 0 | 0 | 0 | 1 | 1 | 0 | 0 | 00000111 | 00011111 |
| 1011 | 0 | 0 | 0 | 0 | 0 | 1 | 1 | 0 | 0 | 00001111 | 00001111 |
| 1010 | 0 | 0 | 0 | 0 | 0 | 1 | 1 | 0 | 0 | 00011111 | 00000111 |
| 1001 | 0 | 0 | 0 | 0 | 0 | 1 | 1 | 0 | 0 | 00111111 | 00000011 |
| 1000 | 0 | 0 | 0 | 0 | 0 | 1 | 1 | 0 | 0 | 01111111 | 00000001 |
| 0111 | 1 | 0 | 1 | 0 | 1 | 1 | 0 | 0 | 0 | 11111111 | 00000000 |
| 0110 | 0 | 0 | 0 | 0 | 1 | 1 | 0 | 0 | 0 | 01111111 | 00000001 |
| 0101 | 0 | 0 | 0 | 0 | 1 | 1 | 0 | 0 | 0 | 00111111 | 00000011 |
| 0100 | 0 | 0 | 0 | 0 | 1 | 1 | 0 | 0 | 0 | 00011111 | 00000111 |
| 0011 | 0 | 0 | 0 | 0 | 1 | 1 | 0 | 0 | 0 | 00001111 | 00001111 |
| 0010 | 0 | 0 | 0 | 0 | 1 | 1 | 0 | 0 | 0 | 00000111 | 00011111 |
| 0001 | 0 | 0 | 0 | 0 | 1 | 1 | 0 | 0 | 0 | 00000011 | 00111111 |
| 0000 | 0 | 0 | 0 | 0 | 1 | 1 | 0 | 0 | 0 | 00000001 | 01111111 |

FIG. 14

SHIFT-REGISTER-BASED CLOCK PHASE INTERPOLATOR

CROSS REFERENCE TO RELATED APPLICATION

This disclosure claims the benefit of commonly-assigned U.S. Provisional Patent Application No. 63/116,540, filed Nov. 20, 2020, which is hereby incorporated by reference herein in its entirety.

FIELD OF USE

This disclosure relates to clock phase interpolation circuitry for the serializer/deserializer of an integrated circuit device. More particularly, this disclosure relates to phase interpolation circuitry that accommodates interpolation among an arbitrary number of clock phases.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

Most integrated circuit devices are clocked. Many clocked functions, including, for example, serializer/deserializer (SerDes) circuitry in serial communication links may use phase interpolation to adjust the phase of a clock signal. For example, phase interpolation may be used in, among other functions, a clock-data recovery (CDR) loop to adjust the sampling phase of input data or in a phase-locked loop (PLL) to generate a fractional clock multiplier.

In known phase interpolator implementations, the desired or required phase interpolation, once determined, may be represented by a binary phase control code. The phase control code is the concatenation of a most significant bit (MSB) portion that represents which two adjacent ones of the available clock phases should be interpolated, and a least significant bit (LSB) portion that represents the relative weights of the two adjacent phases.

Such known phase interpolator implementations are limited to situations in which the number of available phases can be represented as a power of 2 ($2^n$; n=2,3,4) in order to provide a smooth transition when the phasor wraps around from last phase to first phase. Moreover, when the number of phases to be interpolated is $2^n$, the bit width of MSB section of the phase control code is n, meaning that the phase decoder must become larger—and therefore more expensive and power intensive—as the number of phases increases.

SUMMARY

In accordance with implementations of the subject matter of this disclosure, an integrated circuit device includes functional circuitry, and serializer/deserializer circuitry for serial communication with the functional circuitry. The serializer/deserializer circuitry includes phase interpolator circuitry for interpolating phases of a clock signal of the integrated circuit device. The phase interpolator circuitry includes a phase shift register having storage locations configured to represent the phases of the clock signal, and phase rotation control circuitry configured to decode a phase code signal to determine a shifting direction for phase selections in storage locations of the phase shift register.

In a first implementation of such an integrated circuit, the phase rotation control circuitry may be configured to determine the shifting direction based on only the most significant bit and the second most significant bit of the phase code signal.

In a second implementation of such an integrated circuit, the phase interpolator circuitry may further include weight decoder circuitry configured to derive, from the phase code signal, interpolation weights to control combination of selected phases of the clock signal.

According to a first aspect of that second implementation, the weight decoder circuitry may include a binary-to-thermometer decoder.

In one instance of that first aspect, the phase interpolator circuitry may further include weight direction control circuitry configured to invert outputs of the weight decoder circuitry to prevent discontinuities in the output of the weight decoder circuitry when the output of the weight decoder circuitry changes to a subsequent state from a state where all bits are the same.

According to a second aspect of the second implementation, the phase interpolator circuitry may further include phase-and-weight selection circuitry configured to combine the output of the weight decoder circuitry with the phase selections in the storage locations of the phase shift register to assign the interpolation weights to two adjacent phases of the clock signal that are selected by the phase selections, to yield a respective weighted phase vector for each of the two adjacent phases of the clock signal.

In a first instance of that second aspect, the phase interpolator circuitry may further include phase interpolation circuitry configured to combine the two weighted phase vectors into an analog timing signal.

In a first variant of that first instance of the second aspect, the phase interpolation circuitry may include current mirror circuitry, a resistor in one leg of the current mirror circuitry, and a plurality of phase interpolation slice units, corresponding in number to bits of the interpolation weights. Each one of the phase interpolation slice units may be parallel to each other one of the phase interpolation slice units and may be in series with the resistor. Each one of the phase interpolation slice units may include respective phase switches corresponding to respective ones of the phases of the clock signal and controlled by values in the storage positions of the phase shift register, and a respective weight switch in series with each respective one of the phase switches and controlled by a respective bit position in the output of a respective weighted phase vector. For each one of the phases of the clock signal selected by one of the respective phase switches, all phase interpolation slice units for which a respective weight switch is closed may contribute to pulling current through the resistor to yield a value of the analog timing signal.

In that variant, when the clock phase signals are differential signals, the phase interpolation circuitry may include a first instance of the phase interpolation circuitry for one leg of a differential clock phase signal, and a second instance of the phase interpolation circuitry for another leg of the differential clock phase signal.

In a second variant of that first instance of the second aspect, the phase interpolator circuitry may further include buffer circuitry to amplify the analog timing signal into a rail-to-rail clock signal.

In accordance with implementations of the subject matter of this disclosure, a method for interpolating phases of a clock signal in a serializer/deserializer of an integrated circuit device includes representing the phases of the clock signal by storage locations in a phase shift register, and decoding a phase code signal to determine a shifting direction for phase selections in storage locations of the phase shift register.

According to a first aspect of such a method, decoding a phase code signal to determine a shifting direction may include determining the shifting direction based on only the most significant bit and the second most significant bit of the phase code signal.

According to a second aspect, such a method may further include deriving, from the phase code signal, interpolation weights for selected phases of the clock signal.

In a first instance of that second aspect, deriving interpolation weights from the phase code signal may include binary-to-thermometer decoding of the phase code signal.

In a variant of that first instance, the method may further include inverting the interpolation weights to prevent discontinuities in the interpolation weights when one of the interpolation weights changes to a subsequent state from a state where all bits are the same.

In a second instance of that second aspect, the method may further include combining the interpolation weights with the phase selections in the storage locations of the phase shift register to assign the interpolation weights to two adjacent phases of the clock signal that are selected by the phase selections, to yield a respective weighted phase vector for each of the two adjacent phases of the clock signal.

In a variant of that second instance, the method may further include combining the two weighted phase vectors into an analog timing signal.

In a first version of that variant, combining the two weighted phase vectors into an analog timing signal may include, for each respective phase, closing a respective switch according to each bit in a respective one of the weighted phase vectors to contribute to drawing current through a resistor in one leg of current mirror circuitry to yield a value in the analog timing signal.

That first version may include, when the clock phase signals are differential signals, separately combining the two weighted phase vectors for each leg of the differential clock phase signal.

A second version of that variant may further include amplifying the analog timing signal into a rail-to-rail clock signal.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 13 is a table showing an example of an implementation of the subject matter of this disclosure in which a 4-bit phase control code increases;

FIG. 14 is a table showing an example of an implementation of the subject matter of this disclosure in which a 4-bit phase control code decreases.

DETAILED DESCRIPTION

In accordance with implementations of the subject matter of this disclosure, an integrated circuit including a SERDES, which incorporates clock-data recovery (CDR) circuitry, also includes a phase interpolator as part of the CDR circuitry.

The phase interpolator includes a decoder in which a shift register is configured with a number of shift register positions corresponding to the number of phases among which interpolation is to be performed. A '1' in each of two adjacent shift register positions signifies the two adjacent phases to be interpolated. Thus, each of only two of the shift register positions is occupied by a '1' and each of the remaining shift register positions is occupied by a '0'. The shifting of the two '1s' through the shift register to select the correct phases, based on the MSB portion of the phase control code, is described in more detail below.

In addition, a weight decoder is configured to decode the LSB part of input binary phase control code to determine how much to weight each of the adjacent phases in the interpolation operation. A weight direction control is configured to control whether to increase or decrease the weight. A phase rotation control is configured to control the direction of phase rotation direction—either "clockwise" (increasing phase angle) or "counterclockwise" (decreasing phase angle)—when combining the two adjacent phases to be interpolated. A phase-and-weight selector is configured to apportion the appropriate weight into the selected phases. Phase interpolation circuitry is configured to add vectors representing the two phases and their respective weights. A buffer may be configured to amplify the summation of the two weighted phase vectors into a rail-to-rail signal, which may be a single-ended signal or a differential signal.

In some implementations, the weight decoder may include a binary-to-thermometer decoder, also known as a binary-to-unary decoder, to convert binary weight inputs into a unary representation. A weight swap control may be provided so that when the weight reaches a maximum, the unary representation decreases regardless of the direction in which the phase control code is changing, to prevent discontinuities in the interpolation weights when one of the interpolation weights changes to a subsequent state from a state where all bits are the same.

In some implementations, the phase control code may be used to determine the phase rotation direction—clockwise or counterclockwise. In such implementations, only the most significant bit (MSB) and the second most significant bit may be used to determine the rotation direction. For example, the clock phase may be rotated clockwise when the phase control code increases, may be rotated counterclockwise when the phase control code decreases.

The subject matter of this disclosure may be better understood by reference to FIGS. 1-15.

Figure 1:
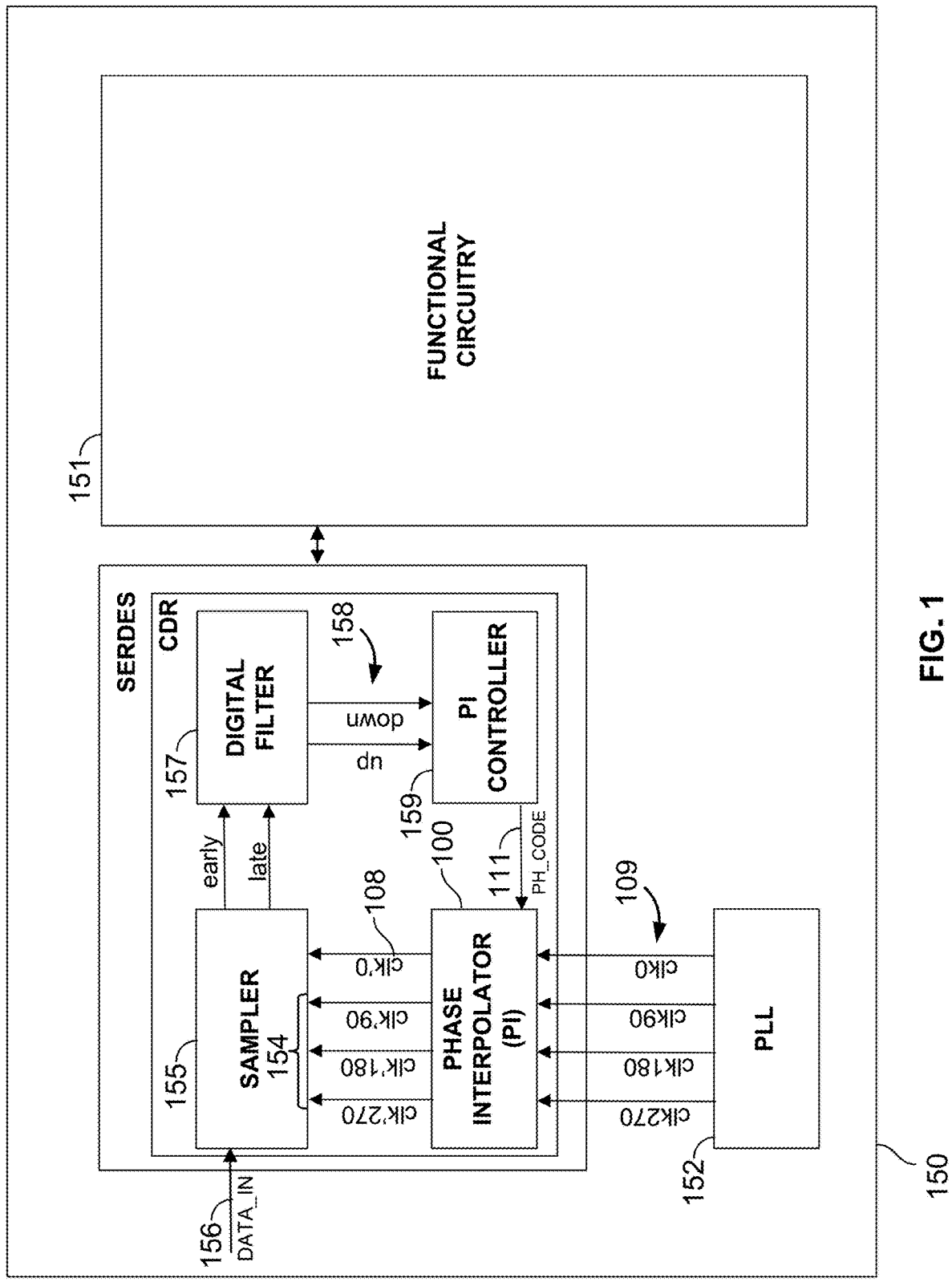
FIG. 1 is a block diagram of a sample integrated circuit device incorporating a phase interpolator according to implementations of the subject matter of this disclosure.

FIG. 1 shows a block diagram of an integrated circuit device 150, including functional circuitry 151 that carries out the functions for which integrated circuit device 150 is used. Integrated circuit device 150 includes a clock source 152, such as a PLL. In some implementations, PLL 152 may provide, e.g., a clock 109 having four phases—clk0, clk90, clk180 and clk270—that are uniformly spaced apart by 90° of phase. CDR circuitry 153 includes a phase interpolator 100, as described below, in accordance with implementations of the subject matter of this disclosure, that interpolates among the clock phases output by PLL 152, and outputs an interpolated clock signal 108 (clk'0) along with its quadrature phases 154 at 90° (clk'90), 180° (clk'180) and 270° (clk'270). A sampler 155 in CDR circuitry 153 samples incoming data 156 and compares the sampled data to clock signal 108 (including phases 154) and determines whether data 156 is early or late relative to clock signal 108. Digital filter 157 (which may be an N-bit binary counter) uses the early/late determination to output an up/down control signal 158 to phase interpolator controller 159. Phase interpolator controller 159 outputs a phase code (PH_CODE) signal 111 which controls phase interpolator 100 as described below.

Figure 2:
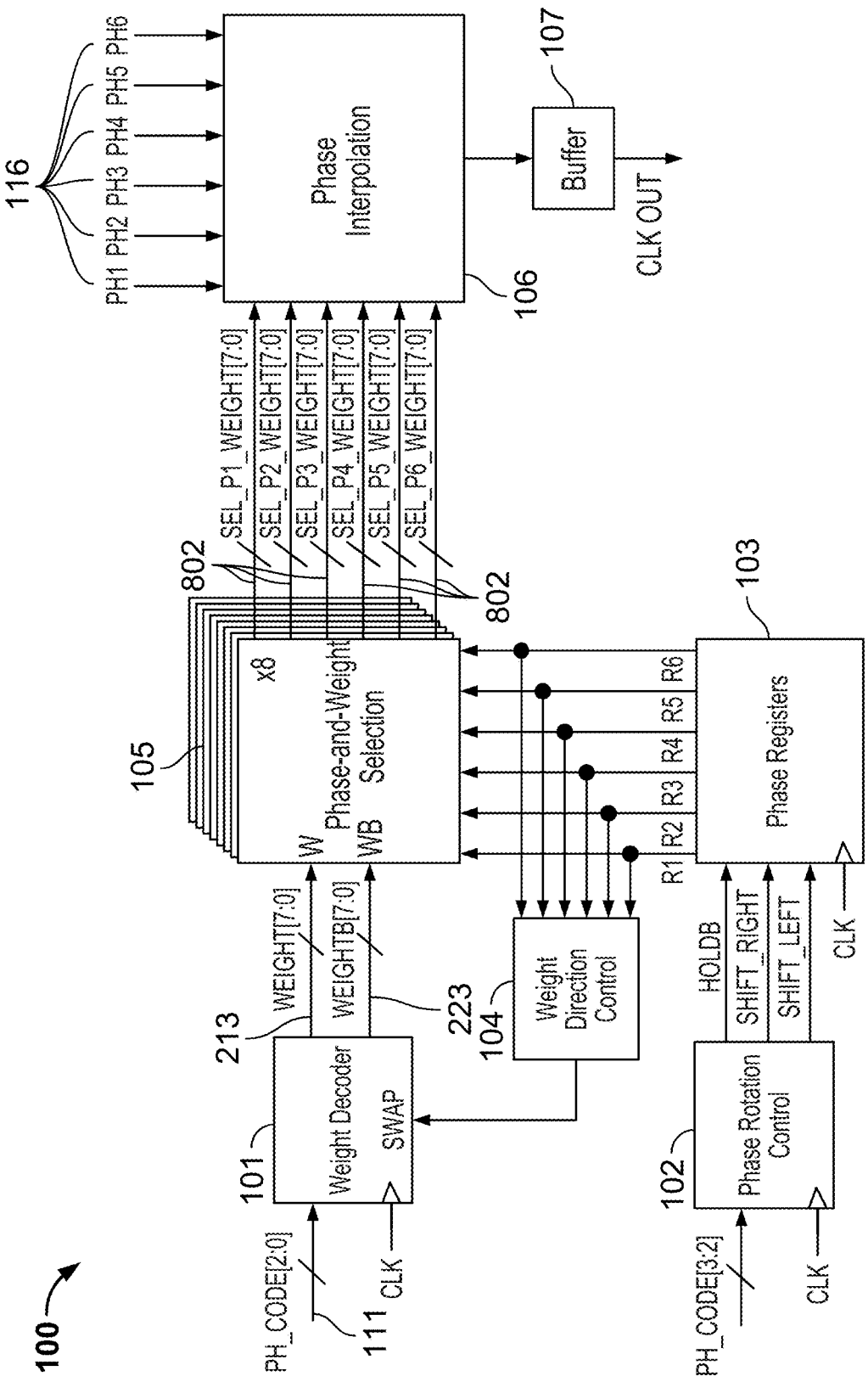
FIG. 2 is a block diagram of a phase interpolator according to implementations of the subject matter of this disclosure.

FIG. 2 shows a block diagram of a phase interpolator 100 according to implementations of the subject matter of this disclosure. Phase interpolator 100 includes weight decoder circuitry 101, phase rotation control circuitry 102, phase shift register circuitry 103, weight direction control circuitry 104, phase-and-weight selection circuitry 105, phase interpolation circuitry 106 and buffer 107.

In one example of such an implementation, the number of phases among which interpolation is to be performed is six, and the phase control code has four bits (PH_CODE[3:0]). Weight decoder circuitry 101 decodes the least three significant bits into eight levels of weight. Phase rotation control circuitry 102 uses the two most significant bits of PH_CODE[3:0] to determine the phase rotation direction—clockwise or counterclockwise. Phase shift register circuitry 103 has a number of positions equal to the number of phases to be interpolated, and is configured to hold the values in those position, shift those values one position to the right, or shift those values one position to the left. In each position of shift register 103, a '1' signifies that a corresponding one of the phases is one of the phases to be interpolated.

Phase-and-weight selection circuitry 105 is configured to apply the weights into the selected phases. Weight direction control circuitry 104 is configured to make sure that the weight is attributed to the correct phases (or to the one correct phase in the event one phase has weight '1' and one phase has weight '0') no matter which direction the interpolated phase is to be rotated. Phase interpolation circuitry 106 combines two weighted phase vectors into one analog signal. Buffer 107 is configured to amplify the analog clock signal into a full rail-to-rail clock.

Figure 3:
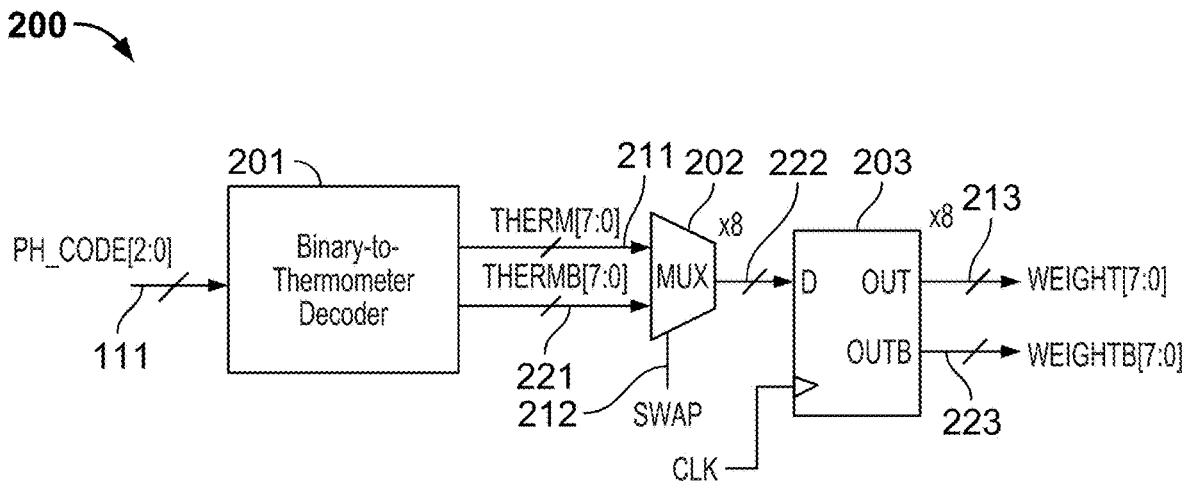
FIG. 3 is a block diagram of an implementation of a weight decoder, based on a binary-to-thermometer decoder, according to implementations of the subject matter of this disclosure.

FIG. 3 is a block diagram of an implementation 200 of weight decoder 101, based on a binary-to-thermometer decoder 201 which converts the two most significant bits of the phase code 111 to an 8-bit output 211 including a 7-bit unary number followed by a '0' (THERM[7:0]), as well as its inverse 221 ending in a '1' (THERMB[7:0], although other implementations may operate on, and generate, other numbers of bits. Multi-bit multiplexer 202, which may be a set of 1-bit multiplexers, selects between output 211 and inverted output 221 based on SWAP signal 212. SWAP signal 212 may be provided by weight direction control circuitry 104 as described below in connection with FIG. 5. As the binary input cycles through one cycle of the 8-bit unary output, there is the potentially for discontinuities in the transition from one unary output to another as the state changes. For example, from a state where output 211 is all '1s', the next state may cycle back to the first state, which may be a discontinuous jump. Swapping between outputs 211 and 221 after output 211 is all '1s' (or all '0s') can prevent discontinuities in the interpolation weights. The selected output 222 may be registered at 203, and output as WEIGHT[7:0] signal 213 and its inverse WEIGHTB[7:0] 223. For example, a multi-bit flip-flop, or multiple 1-bit flip-flops, may be provided.

Figure 4:
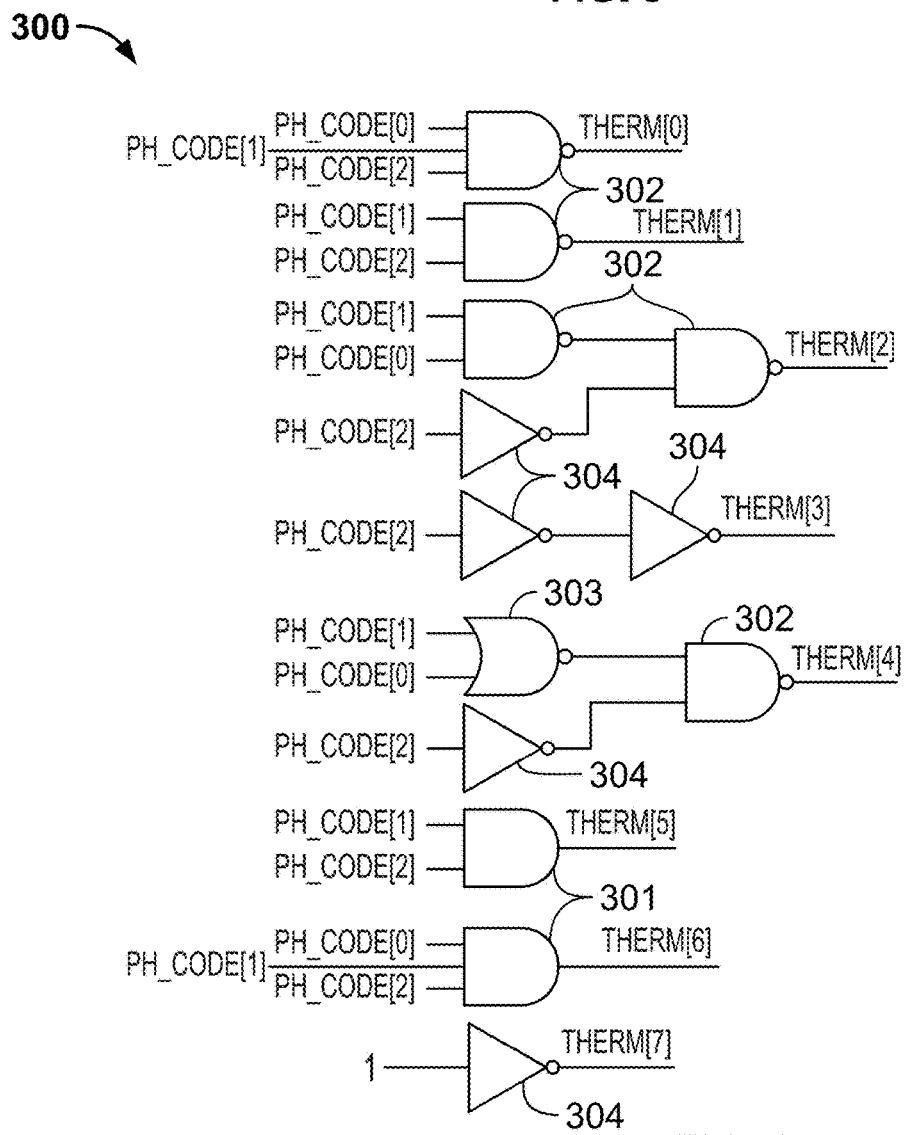
FIG. 4 shows one possible implementation, according to implementations of the subject matter of this disclosure, of a binary-to-thermometer decoder that may be used in the weight decoder of FIG. 2.

While there may be multiple potential implementations of a binary-to-thermometer decoder, FIG. 4 shows one possible implementation 300 of a binary-to-thermometer decoder for converting a 3-bit binary phase code input (PH_CODE[2:0]) to an 8-bit unary output (THERM[7:0]) using AND-gates 301, NAND-gates 302, NOR-gate 303, and inverters 304. Only the bits THERM[0] through THERM[7] of positive output 211 (THERM[7:0]) are shown, but additional inverters (not shown) convert positive output 211 (THERM[7:0]) to inverted output 221 (THERMB[7:0]).

Figure 5:
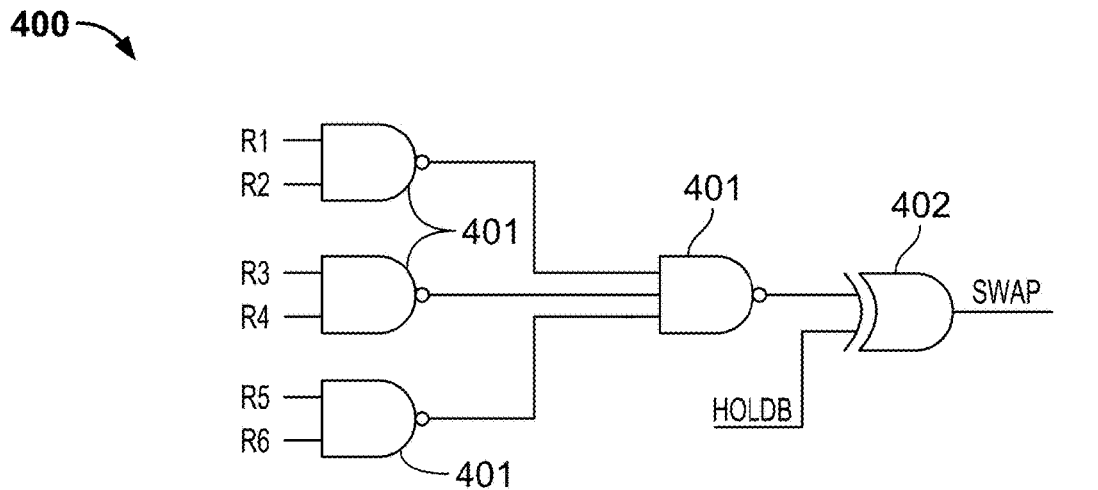
FIG. 5 shows weight direction control circuitry according to an implementation of the subject matter of this disclosure.

FIG. 5 shows an implementation 400 of weight direction control circuitry 104 for a six-phase example, including NAND-gates 401 and EXCLUSIVE-OR-gate 402, to generate the SWAP signal to swap the binary-to-thermometer decoder outputs 211 and 221. The swap is triggered (i.e., SWAP is asserted), when either R1 and R2, R3 and R4, or R5 and R6 are the selected phases, and the most significant bit of the phase control code changes, meaning that shift register 103 is advancing (in one direction or the other) so that HOLD=1 and HOLDB=0.

Figure 6:
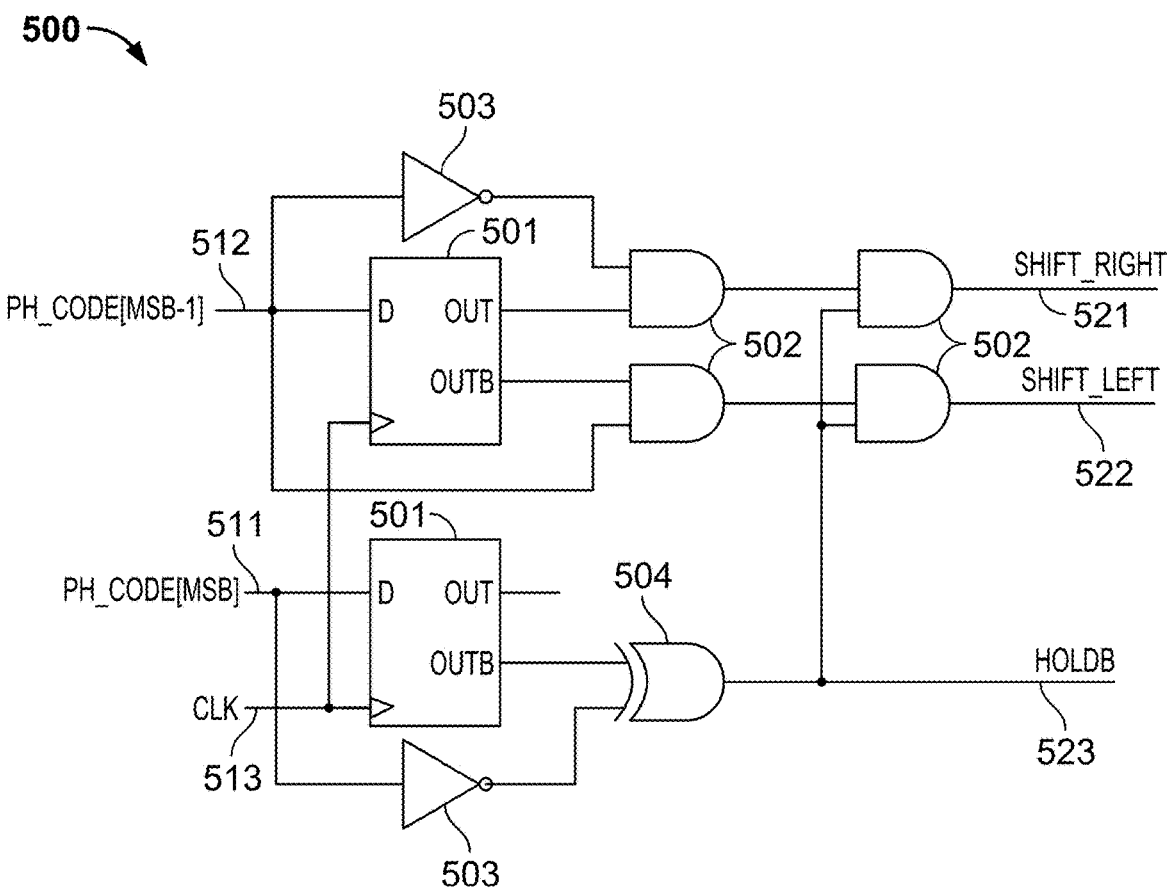
FIG. 6 shows phase rotation control circuitry according to an implementation of the subject matter of this disclosure.

Signals HOLD and HOLDB, along with signals SHIFT_RIGHT and SHIFT_LEFT which determine whether phase shift register 103 advances (in one direction or the other), are generated by phase rotation control circuitry 102. An implementation 500 of phase rotation control circuitry 102 is shown in FIG. 6, and includes flip-flops 501, AND-gates 502, inverters 503 and EXCLUSIVE-OR-gate 504. The inputs are the most significant bit 511 (PH_CODE[MSB]) of the phase code 111, the next most significant bit 512 (PH_CODE[MSB−1]) of the phase code 111, and the system clock 513 (CLK), while the outputs, which control phase shift register 103, are SHIFT_RIGHT 521, SHIFT_LEFT 522 and HOLDB 523 (from which HOLD may be derived).

The three control commands SHIFT_RIGHT 521, SHIFT_LEFT 522 and HOLDB 523 are generated as follows.

Figure 7:
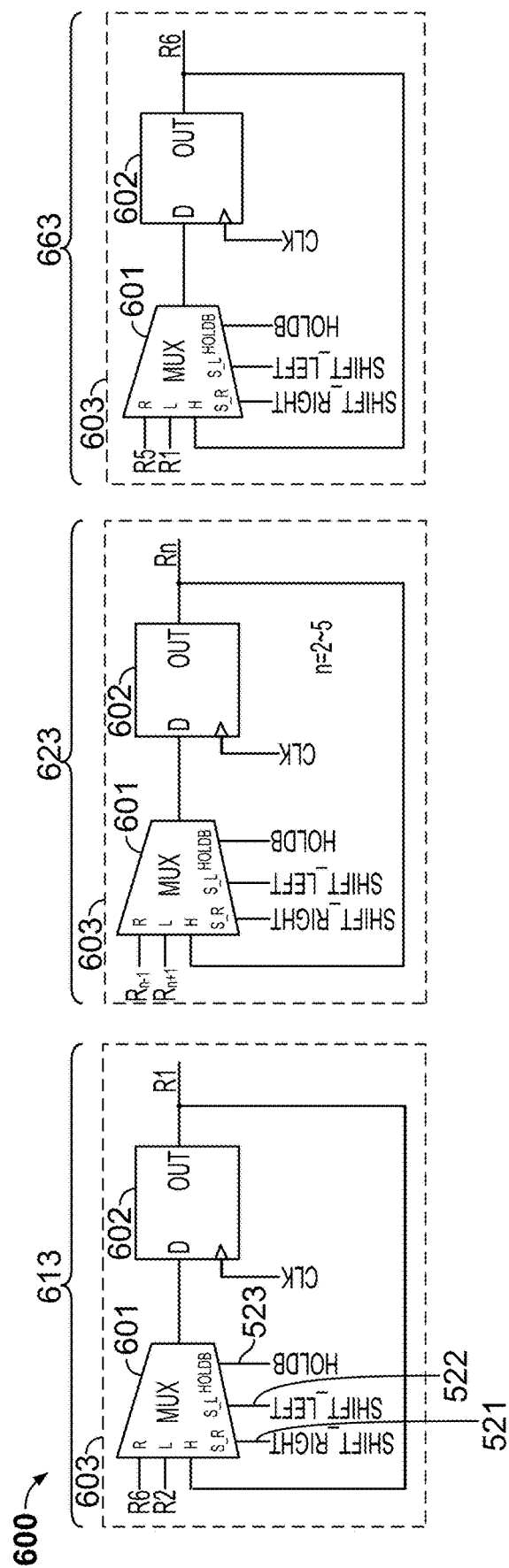
FIG. 7 is a block diagram of a phase shift register according to an implementation of the subject matter of this disclosure.
Figure 8:
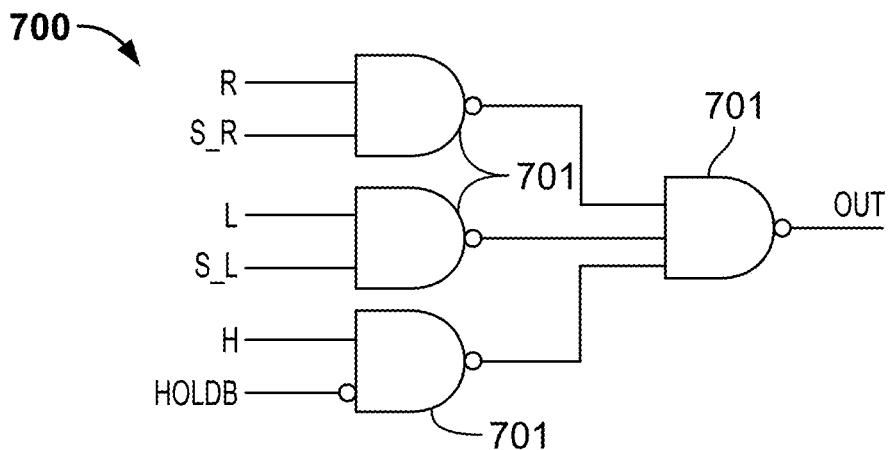
FIG. 8 is a block diagram of a multiplexer according to an implementation of the subject matter of this disclosure.

HOLD signifies that phase shift register 103 holds its current values in place without shifting, and HOLDB is the inversion of HOLD. HOLDB is asserted when the current most significant bit of the phase code 111 (PH_CODE$_n$[MSB]) and the previous most significant bit of the phase code 111 (PH_CODE$_{n-1}$[MSB]) are the same. Flip-flops 501 retain the previous phase code value so that that comparison can be made. The derivation of HOLDB is:

HOLD$B$=$\overline{\text{(PH\_CODE}_n\text{[MSB]} \oplus \text{PH\_CODE}_{n-1}\text{[MSB])}}$ When SHIFT_RIGHT is asserted, the values in phase shift register 103 are shifted to the right. SHIFT_RIGHT is asserted when HOLDB is asserted and the next most significant bit (i.e., the bit to the right of the most significant bit) of phase code 111 (PH_CODE[MSB−1]) has changed from a previous value of '0' to a current value of '1'. Again, flip-flops 501 retain the previous phase code value so that that comparison can be made. The derivation of SHIFT_RIGHT is:

SHIFT_RIGHT=
$\overline{\text{PH\_CODE}_n\text{[MSB−1]}}$·PH_CODE$_{n-1}$[MSB−1]·HOLD$B$ When SHIFT_LEFT is asserted, the values in phase shift register 103 are shifted to the left. SHIFT_LEFT is asserted when HOLDB is asserted and the next most significant bit of phase code 111 (PH_CODE[MSB−1]) has changed from a previous value of '1' to a current value of '0'. Again, flip-flops 501 retain the previous phase code value so that that comparison can be made. The derivation of SHIFT_LEFT is:

SHIFT_LEFT=
$\overline{\text{PH\_CODE}_{n-1}\text{[MSB−1]}}$·PH_CODE$_n$[MSB−1]·HOLD$B$ An implementation 600 of phase shift register 103 is shown in FIGS. 7 and 8. Each shift register storage position 603 includes a three-input multiplexer 601 and a flip-flop 602. FIG. 8 shows an example of an implementation 700 of multiplexer 601 using NAND-gates 701. Three-input multiplexer 700 has three control signals SHIFT_RIGHT 521, SHIFT_LEFT 522 and HOLDB 523. At any one time, only one of the control signals SHIFT_RIGHT 521, SHIFT_LEFT 522 and HOLDB 523 is asserted and its corresponding input is selected for output by multiplexer 700.

In the aforementioned example implementation in which the clock has six equally divided phases, which may be identified as R1, R2, R3, R4, R5 and R6, there are six phase shift register storage locations 603 are provided. The first and last storage locations 613, 663 (R1 and R6 in the six-phase example) are separately shown. The intermediate storage locations (R2, R3, R4 and R5 in the six-phase example) are represented by a single nth storage location 623 (n=2, . . . , 5 in the six-phase example). Because there are six storage locations in the six-phase example, the 'R' input and the output of phase shift register storage location 663 are identified as 'R5' and 'R6' but in a more general case of m storage locations, the 'R' input and the output of phase shift register storage location 663 would be R(m−1) and Rm, respectively. It can be seen that in this implementation 600, the individual phase shift register storage locations 613, 623, 663 could hold their values when HOLDB=0, shift their values to the right when SHIFT_RIGHT=1, and shift their values to the left when SHIFT_LEFT=1. The nature of the two most significant bits of the phase code is such that only two of the phase shift register storage locations will have the value '1', and those positions will be adjacent one another.

Figure 9:
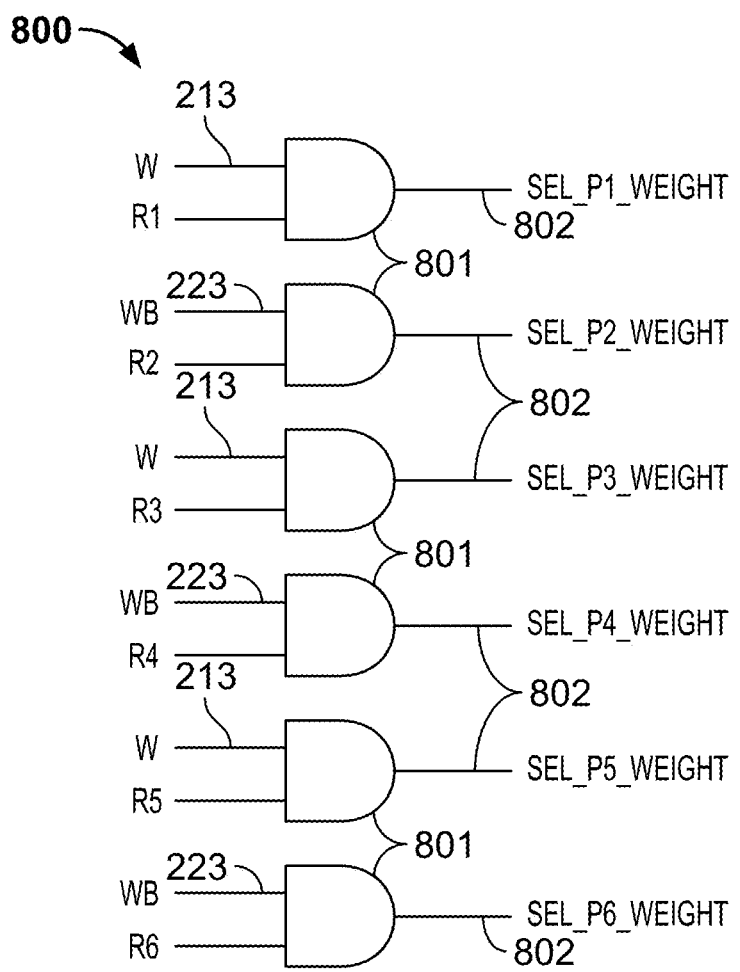
FIG. 9 is a block diagram of phase-and-weight selection circuitry according to an implementation of the subject matter of this disclosure.

The three least significant bits of the phase code are used in weight decoder circuitry 101 to decode the relative weights W 213 (WEIGHT[7:0]) and WB 223 (WEIGHTB[7:0]) (as described above in connection with FIGS. 3 and 4) of the two adjacent phases. The assignment of those weights to the phases identified by the storage locations of phase shift register 103 is performed by phase-and-weight selection circuitry 105. An implementation 800 of phase-and-weight selection circuitry 105 is shown in FIG. 9.

Implementation 800 of phase-and-weight selection circuitry 105 includes a plurality of AND-gates 801 equal in number to the number of phases. Six AND-gates 801 are shown for the six-phase example. Each of AND-gates 801 has one input connected to a respective phase shift register storage location R1, R2, etc. (up to R6 in this example). The other input of each of AND-gates 801 is connected to either weight signal W 213 for the odd phases (R1, R3, R5, etc.) or weight signal WB 223 for the even phases (R2, R4, R6, etc.). Only two adjacent phase shift register storage locations can have the value '1'. The possible combinations of selected phases are R1/R2, R2/R3, R3/R4, R4/R5, R5/R6 and R6/R1. The other phase shift register storage locations will have the value '0'. As seen from FIG. 9 one of any two adjacent phases will couple to positive weight decoder output W 213, and the other of any two adjacent phases will couple to complementary weight decoder output WB 223. Therefore, only two adjacent output weight vectors 802 will be non-zero.

As discussed above in connection with FIG. 2, phase interpolation circuitry 106 combines two weighted phase vectors 802 into one analog signal. As just discussed in connection with FIG. 9, only two of the weight vectors 802 will be non-zero. The various clock phases 116, which may be equiangularly spaced in a phase-angle domain, may be supplied as part of an externally generated clock signal, or circuitry such as delayed-locked loops or clock dividers (not shown) may be used to generate multiple phases from a single clock within phase interpolator 100.

Figure 10:
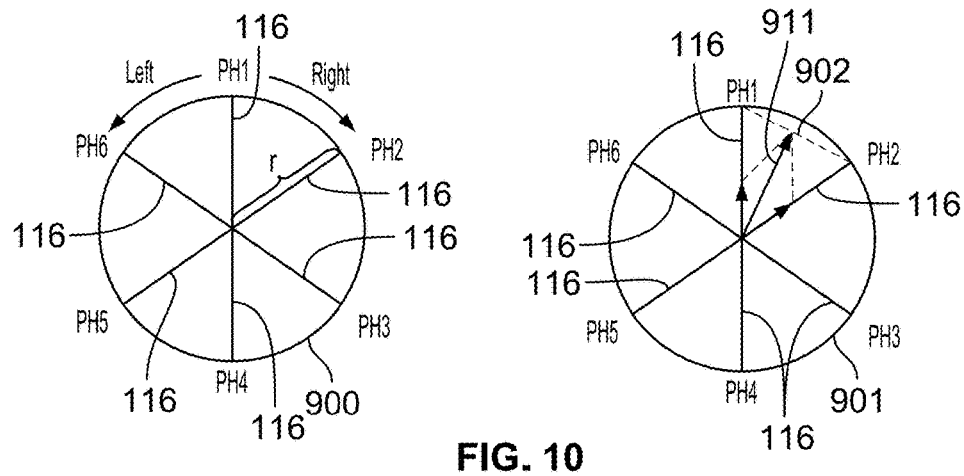
FIG. 10 is a visualization of a vector combination operation according to an implementation of the subject matter of this disclosure.

Phase interpolation circuitry 106 applies the two non-zero weight vectors 802 to their respective ones (PH1/PH2, PH2/PH3, etc.) of phases 116 (which may be derived from phases 109), corresponding to non-zero phase shift register storage locations 603 (R1/R2, R2/R3, etc.) and then combines the weighted phase vectors using a vector addition operation that may be visualized in connection with FIG. 10. As seen at 900, the input clock phases 116 (six in this example) may be visualized as being spaced equiangularly within a 360° (i.e., 2π radian) phase domain. Clockwise rotation is equivalent to shifting to the right, while counterclockwise rotation is equivalent to shifting to the left. A phase vector extending the full radius r of the circular phase domain may be considered to have a weight of 1.0 or 100%.

As seen at 901, the selected phases are PH1 and PH2 corresponding to phase shift register storage locations R1 and R2. Each phase in this example is weighted an equal amount less than 1.0, resulting in an interpolated phase vector at a phase angle halfway between the phases, reaching the line 902 connecting the tips of the radii representing the two phases. If one of the phases were more heavily weighted the vector sum would intersect line 902 closer to the more heavily weighted phase, so that the resultant phase angle would be closer to that more heavily weighted phase.

Figure 11:
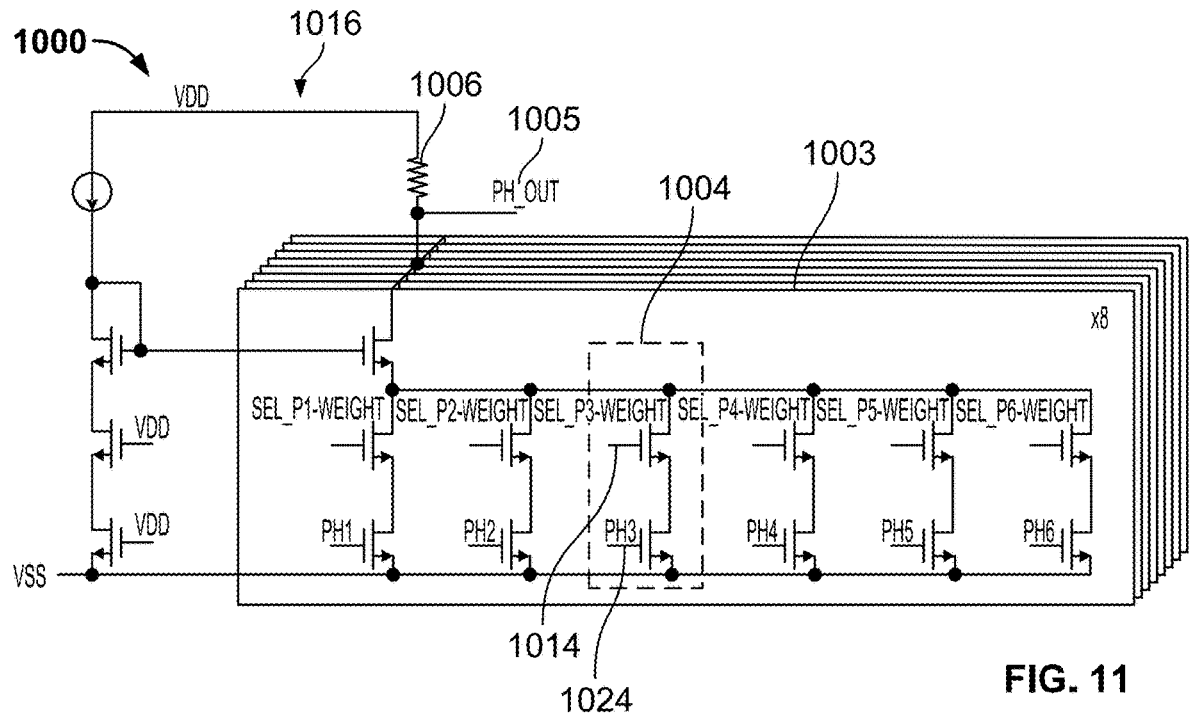
FIG. 11 is a block diagram of phase interpolation circuitry according to an implementation of the subject matter of this disclosure.

An example of a single-ended current-mirror-based circuit implementation 1000 of phase interpolation circuitry 106 is shown in FIG. 11. A number of parallel phase interpolation "slice" units 1003, equal in number to the number of bits in weights 802. Each phase interpolation slice unit 1003 has a number of sets 1004 of phase-and-weight switches, equal in number to the number of phases. Each phase-and-weight switch 1004 includes two cascaded transistors 1014, 1024, which in this implementation are N-type metal-oxide-semiconductor (NMOS) transistors. Each NMOS transistor 1024 is gated by one of phase shift storage location values, so that only the same two adjacent phase-and-weight switches 1004 are active in each phase interpolation slice unit 1003.

Each NMOS transistor 1014 is gated by a respective weight 802 corresponding to the selected phase. However, because the respective NMOS transistor 1014 in each phase interpolation slice unit 1003 is coupled to a different bit of weights 802, the output of each phase interpolation slice unit 1003 will be different. The plurality of phase interpolation slice units 1003 are coupled, in parallel, to PH_OUT output 1005. For the active phase-and-weight switches 1004, their outputs will be different depending on the values of the specific bits of weights 802, and therefore the voltage pulled down through resistor 1006 in one leg of current mirror 1016, will vary, but will be added together into PH_OUT output 1005.

In a differential implementation, a second set of phase interpolation slice units 1003 is included for the second leg of the differential signal.

Figure 12:
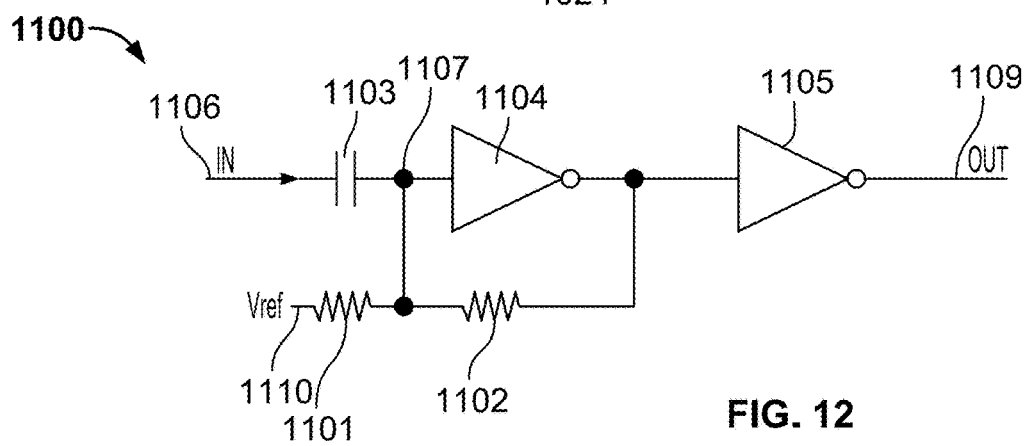
FIG. 12 is a schematic representation of a single-ended output buffer according to an implementation of the subject matter of this disclosure.

FIG. 12 is the schematic representation of a single-ended implementation 1100 of output buffer 107, including an alternating current (AC) capacitor 1103 between input 1106 and input 1107 of first stage inverter 1104. Node 1110 provides the DC voltage $V_{ref}$ to first stage inverter 1104. Adjusting voltage $V_{ref}$ voltage adjusts the duty cycle, and thereby the gain of first stage inverter 1104, although node 1110 could be floating as well. Feedback resistor 1102 coupled to inverter 1104 form an amplifier to increase the output signal to rail-to-rail amplitude output at 1109. Additional inverters 1105 may be cascaded on the output for additional amplification. In a differential implementation, a second instance of buffer 1100 may be provided for the second leg.

FIG. 13 is a table 1200 showing an example in which 4-bit phase control code PH_CODE[3:0] increases. Unless the phase control code MSB changes, HOLDB=0 which means the storage locations of phase shift register 103 hold their values. The rotation direction of phase shift register 103 is controlled by the MSB and the second MSB of the phase control code. If the MSB of the phase control code changes and HOLDB becomes '1', and the second MSB of the phase control code changes from '1' to '0', the values in the storage locations of phase shift register 103 shift right. In this example, there are no left shifts. Complementary phase weights Phase_a and Phase_b are decoded from PH_CODE[2:0]. Once the weight are all 0s or 1s (PH_CODE=1000), Phase_a or Phase_b increases or decreases by 1 step, respectively, because of the swap of the output of binary-to-thermometer decoder 201.

FIG. 14 is table 1300 showing an example in which 4-bit phase control code PH_CODE[3:0] decreases. In this example as well, unless the phase control code MSB changes, HOLDB=0 which means the storage locations of phase shift register 103 hold their values. The rotation direction of phase shift register 103 is controlled by the MSB and the second MSB of the phase control code. If the MSB of the phase control code changes and HOLDB becomes '1', and the second MSB of the phase control code changes from '0' to '1', the values in the storage locations of phase shift register 103 shift left. In this example, there are no right shifts. Complementary phase weights Phase_a and Phase_b are decoded from PH_CODE[2:0]. Once the weight are all 0s or 1s (PH_CODE=1000), Phase_a or Phase_b decreases or increases by 1 step, respectively, because of the swap of the output of binary-to-thermometer decoder 201.

Figure 15:
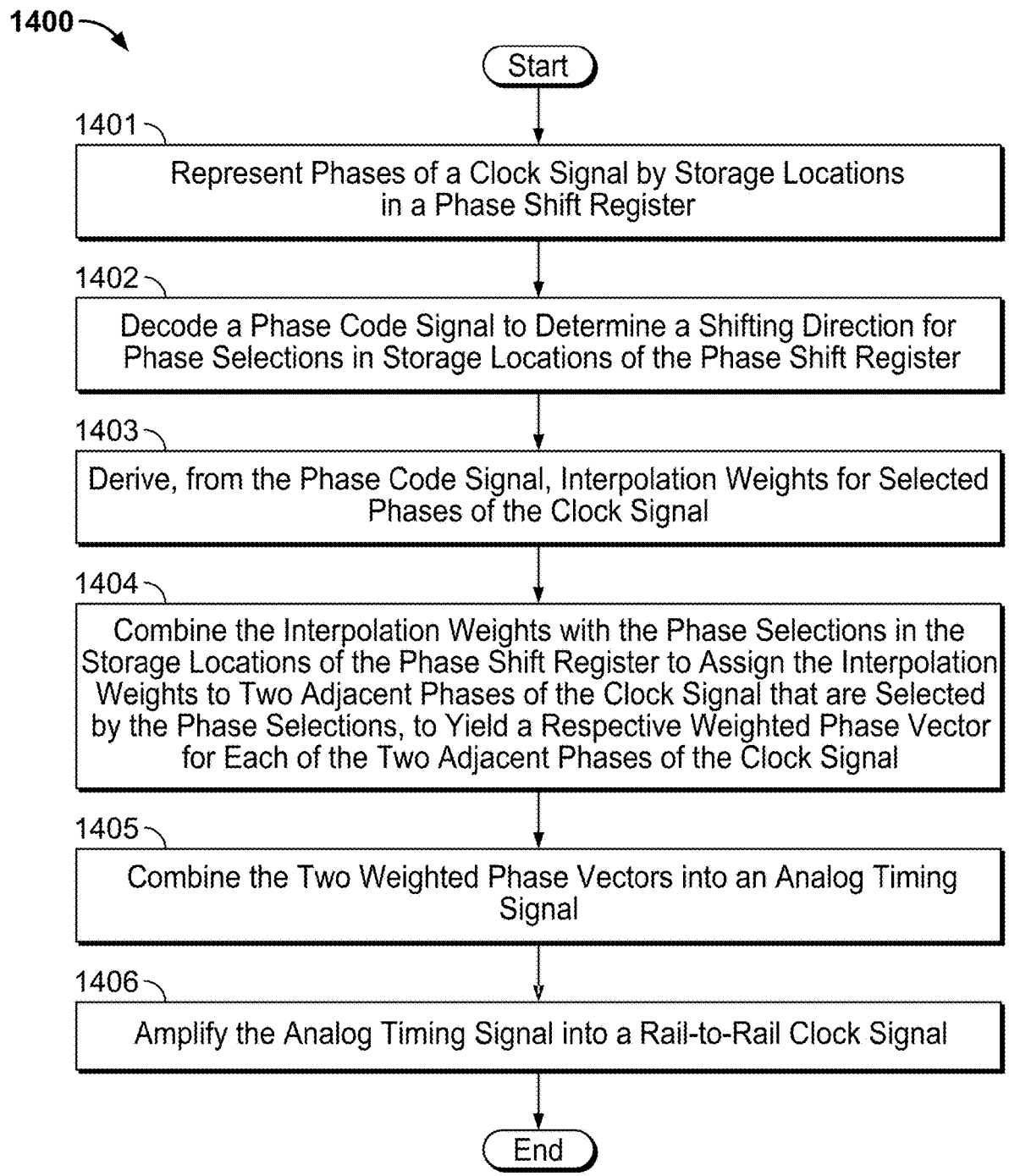
FIG. 15 is a flow diagram of a method according to implementations of the subject matter of this disclosure.

A method 1400 according to implementations of the subject matter of this disclosure for interpolating phase angle is diagrammed in FIG. 15.

Method 1400 starts at 1401 where phases of a clock signal are represented by storage locations in a phase shift register. At 1402, a phase code signal is decoded to determine a shifting direction for phase selections in storage locations of the phase shift register. At 1403, interpolation weights are derived from the phase code signal for selected phases of the clock signal. At 1404, the interpolation weights are combined with the phase selections in the storage locations of the phase shift register to assign the interpolation weights to two adjacent phases of the clock signal that are selected by the phase selections, to yield a respective weighted phase vector for each of the two adjacent phases of the clock signal. At 1405, the two weighted phase vectors are combined into an analog timing signal. At 1406, the analog timing signal is amplified into a rail-to-rail clock signal, and method 1400 ends.

Thus it is seen that phase interpolation circuitry that accommodates interpolation among an arbitrary number of clock phases, by using a shift register that can have an arbitrary number of storage locations to represent clock phases, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An integrated circuit device comprising:
   functional circuitry; and
   serializer/deserializer circuitry for serial communication with the functional circuitry, the serializer/deserializer circuitry including phase interpolator circuitry for interpolating phases of a clock signal of the integrated circuit device, the phase interpolator circuitry comprising:
   a phase shift register having storage locations configured to represent the phases of the clock signal;
   phase rotation control circuitry configured to decode a phase code signal to determine a shifting direction for phase selections in storage locations of the phase shift register;
   weight decoder circuitry configured to derive, from the phase code signal, interpolation weights to control combination of selected phases of the clock signal; and
   phase-and-weight selection circuitry configured to derive, using the interpolation weights, a respective weighted phase vector for each of two adjacent phases of the clock signal for interpolating the two adjacent phases.

2. The integrated circuit device of claim 1, wherein the phase rotation control circuitry is configured to determine the shifting direction based on only the most significant bit and the second most significant bit of the phase code signal.

3. The integrated circuit device of claim 1, wherein the weight decoder circuitry comprises a binary-to-thermometer decoder.

4. The integrated circuit device of claim 3, wherein the phase interpolator circuitry further comprises weight direction control circuitry configured to invert outputs of the weight decoder circuitry to prevent discontinuities in the output of the weight decoder circuitry when the output of the weight decoder circuitry changes to a subsequent state from a state where all bits are the same.

5. The integrated circuit device of claim 1, wherein the phase-and-weight selection circuitry is configured to derive the respective weighted phase vector for each of two adjacent phases of the clock signal by using the phase selections in the storage locations of the phase shift register to assign the interpolation weights output by the weight decoder circuitry to the two adjacent phases of the clock signal that are selected by the phase selections.

6. The integrated circuit device of claim 5, wherein the phase interpolator circuitry further comprises phase interpolation circuitry configured to combine the two weighted phase vectors into an analog timing signal.

7. The integrated circuit device of claim 6, wherein the phase interpolation circuitry comprises:
 current mirror circuitry;
 a resistor in one leg of the current mirror circuitry; and
 a plurality of phase interpolation slice units, corresponding in number to bits of the interpolation weights;
 wherein:
 each one of the phase interpolation slice units is parallel to each other one of the phase interpolation slice units and is in series with the resistor;
 each one of the phase interpolation slice units includes:
  respective phase switches corresponding to respective ones of the phases of the clock signal and controlled by values in the storage positions of the phase shift register, and
  a respective weight switch in series with each respective one of the phase switches and controlled by a respective bit position in the output of a respective weighted phase vector; and
 for each one of the phases of the clock signal selected by one of the respective phase switches, all phase interpolation slice units for which a respective weight switch is closed contribute to pulling current through the resistor to yield a value of the analog timing signal.

8. The integrated circuit device of claim 7, wherein, when the clock phase signals are differential signals, the phase interpolation circuitry comprises a first instance of the phase interpolation circuitry for one leg of a differential clock phase signal, and a second instance of the phase interpolation circuitry for another leg of the differential clock phase signal.

9. The integrated circuit device of claim 6, wherein the phase interpolator circuitry further comprises buffer circuitry to amplify the analog timing signal into a rail-to-rail clock signal.

10. A method for interpolating phases of a clock signal in a serializer/deserializer of an integrated circuit device, the method comprising:
 representing the phases of the clock signal by storage locations in a phase shift register;
 decoding a phase code signal to determine a shifting direction for phase selections in storage locations of the phase shift register;
 deriving, from the phase code signal, interpolation weights for selected phases of the clock signal; and
 deriving, using the interpolation weights, a respective weighted phase vector for each of two adjacent phases of the clock signal for interpolating the two adjacent phases.

11. The method of claim 10, wherein decoding a phase code signal to determine a shifting direction comprises determining the shifting direction based on only the most significant bit and the second most significant bit of the phase code signal.

12. The method of claim 10, wherein deriving interpolation weights from the phase code signal comprises binary-to-thermometer decoding of the phase code signal.

13. The method of claim 12, further comprising inverting the interpolation weights to prevent discontinuities in the interpolation weights when one of the interpolation weights changes to a subsequent state from a state where all bits are the same.

14. The method of claim 10, wherein deriving, using the interpolation weights, a respective weighted phase vector for each of two adjacent phases of the clock signal, comprises combining the interpolation weights with the phase selections in the storage locations of the phase shift register to assign the interpolation weights to two adjacent phases of the clock signal that are selected by the phase selections.

15. The method of claim 14, further comprising combining the two weighted phase vectors into an analog timing signal.

16. The method of claim 15, wherein combining the two weighted phase vectors into an analog timing signal comprises, for each respective phase, closing a respective switch according to each bit in a respective one of the weighted phase vectors to contribute to drawing current through a resistor in one leg of current mirror circuitry to yield a value in the analog timing signal.

17. The method of claim 16, comprising, when the clock phase signals are differential signals, separately combining the two weighted phase vectors for each leg of the differential clock phase signal.

18. The method of claim 15, further comprising amplifying the analog timing signal into a rail-to-rail clock signal.

* * * * *